United States Patent
Thalheim et al.

(10) Patent No.: US 7,253,540 B1
(45) Date of Patent: Aug. 7, 2007

(54) METHOD FOR OPERATING A PARALLEL ARRANGEMENT OF SEMICONDUCTOR POWER SWITCHES

(75) Inventors: Jan Thalheim, Obfelden (CH); Heinz Ruedl, Evilard (CH)

(73) Assignee: CT Concept Technologie AG, Biel (CH)

( * ) Notice: Subject to any disclaimer, the term of this patent is extended or adjusted under 35 U.S.C. 154(b) by 0 days.

(21) Appl. No.: 10/221,749

(22) PCT Filed: Mar. 15, 2000

(86) PCT No.: PCT/IB00/00277

§ 371 (c)(1),
(2), (4) Date: May 8, 2003

(87) PCT Pub. No.: WO01/69784

PCT Pub. Date: Sep. 20, 2001

(51) Int. Cl.
*H01H 19/14* (2006.01)

(52) U.S. Cl. .................. 307/115; 327/403; 327/405; 323/282

(58) Field of Classification Search ............... 324/403; 307/117, 115; 327/403, 405; 323/272, 282
See application file for complete search history.

(56) References Cited

U.S. PATENT DOCUMENTS

| | | | | |
|---|---|---|---|---|
| 4,616,142 A * | 10/1986 | Upadhyay et al. | .......... | 327/405 |
| 4,965,710 A | 10/1990 | Pelly et al. | ............ | 363/56 |
| 5,422,588 A * | 6/1995 | Wynne | ............ | 327/437 |
| 5,610,807 A * | 3/1997 | Kanda et al. | ........... | 363/43 |
| 5,801,572 A * | 9/1998 | Nakamura | ............ | 327/434 |
| 5,903,067 A * | 5/1999 | Sato et al. | .......... | 307/113 |
| 5,969,514 A * | 10/1999 | Merrill | ............ | 323/283 |
| 6,137,077 A * | 10/2000 | Moro et al. | .......... | 219/108 |
| 6,404,173 B1* | 6/2002 | Telefus | ............ | 323/272 |
| 6,545,518 B2* | 4/2003 | Saeki | ............ | 327/116 |
| 6,979,982 B2* | 12/2005 | Herbert | ............ | 323/272 |
| 2002/0021114 A1* | 2/2002 | Marino et al. | .......... | 323/272 |

FOREIGN PATENT DOCUMENTS

| | | |
|---|---|---|
| EP | 0 409 384 | 1/1991 |
| EP | 0 664 613 | 7/1995 |
| EP | 0 685 940 | 12/1995 |
| FR | 2 270 635 | 12/1975 |

* cited by examiner

*Primary Examiner*—Chau N. Nguyen
*Assistant Examiner*—Daniel Cavallari
(74) *Attorney, Agent, or Firm*—Kenyon & Kenyon LLP

(57) ABSTRACT

The invention relates to a method for statically balancing the loading of power semiconductor switches ($S_1$, $S_2$, $S_3$) in a parallel circuit (1). To achieve this in prior art, switching instants of individual switches ($S_1$, $S_2$, $S_3$) are adapted in the case of GTOs and current amplitudes of individual switches are adapted in the case of IGBTs. According to the invention, a primary pattern (4) of frame-switching pulses is predetermined for a total current (i) through the parallel circuit (1) and a secondary pattern (51, 52, 53) comprising more or fewer pulses than the primary pattern (4) is generated for at least one switch ($S_1$, $S_2$, $S_3$). In contrast in conventional methods, the asynchronicity of the pulses enables a rapid redistribution of the loading between the parallel switches ($S_1$, $S_2$, $S_3$), thus reducing or obviating the need for inductive suppressor circuits for limiting the current. The method is compatible with methods for the dynamic synchronization of transient switching and is suitable for "latching" and amplitude-controlled power semiconductor switches ($S_1$, $S_2$, $S_3$). The examples relate to the addition or omission of subordinate switching pulses during long or short frame-switching pulses and to an active control (6) of the number of subordinate switching pulses, depending on the loading of the switches ($S_1$, $S_2$, $S_3$).

17 Claims, 2 Drawing Sheets

METHOD FOR OPERATING A PARALLEL ARRANGEMENT OF SEMICONDUCTOR POWER SWITCHES

BACKGROUND OF THE INVENTION

This invention relates to the field of power electronics. It relates to a method for operating a parallel circuit of semiconductor power switches in accordance to the preamble of the independent claim.

Such a method is disclosed in EP 0 409 384 A2. There, stationary partial currents are symmetrised with parallel switches, such as thyristors or GTOs (gate turn-off thyristors), by their turn-on times being individually shifted forward or backward. The necessary delay times are calculated in dependence of the momentary partial currents and applied to a subsequent total current pulse through the parallel circuit. Large inductors in series with the GTOs are arranged for limiting the current rise in the GTOs that are turned-on in a delayed manner. But this prolongs the turn-on times and increases the dynamic losses.

In EP 0 664 613 A2 transient and stationary currents through parallel IGBTs ("Insulated Gate Bipolar Transistor") are symmetrised, on the one hand by snychronising the turn-on and turn-off times and, on the other hand, by regulating the height of the gate control pulses and thereby the stationary current amplitudes of each IGBT individually. The regulation is made in response to a measured thermal load of each IGBT. In this circuit large inductors in series can be avoided. Anyhow, an equalization of the stationary thermal loads of the IGBTs by means of current amplitude regulation is only possible with large time constants over many switching cycles and therefore comparatively inaccurate. Moreover the method is inapplicable to semiconductor power switches that can not be regulated by amplitude.

SUMMARY OF THE INVENTION

It is an object of the invention to disclose an improved method for operating a parallel circuit of semiconductor power switches, by means of which a thermal overload of individual semiconductor power switches in a stationary state is avoided in a simply way and this for latched as well as for amplitude adjustable semiconductor power switches.

According to the invention the solution is that a master control signal with a primary pattern of frame switching pulses for a total current through the parallel circuit is provided to the parallel circuit, that a secondary pattern of slave switching pulses is generated for the individual control signal for at least one semiconductor power switch, and that, in the primary pattern, at least temporarily during a number of frame switching pulses a different number of slave switching pulses in the secondary pattern is used for relieving the semiconductor power switch of the parallel circuit in a conductive state. Therefore, the number of slave switching pulses per frame switching pulse can be permanently or temporarily chosen to be unequal to one, and in particular it can be changed dynamically according to requirements. Hence, an asynchronous operation of the parallel switches is suggested for symmetrisation of their terminal loads or part currents. With this, individual switches receive more or less switching pulses than it is given by the complete switching pattern according to the requirement of the load current to be supplied by the parallel circuit. The pulse number variation can be implemented with latched and amplitude adjustable semiconductor power switches. In contrast to conventional methods a very fast load redistribution is possible between the parallel switches by means of the asynchronous pulses. Detrimental overload states of individual semiconductor power switches can be identified and corrected immediately, in particular within a frame switching pulse. By the change of the number of switching pulses the total turn-on time and thereby the static losses of the corresponding element are reduced. The resultant momentary additional load currents are, as a rule, normally absolutely harmless for the remaining semiconductor power switches. In particular semiconductor power switch parallel circuits are overdimensioned anyway for the transient overcurrents during turn-on and turn-off. Therefore, momentary overcurrents through some, possibly cooler, elements can also be tolerated in the conducting state of the parallel circuit without problems.

In one embodiment at least temporarily during individual frame switching pulses, several slave switching pulses are generated and/ore omitted in the secondary pattern. Hence, the secondary pattern has slave switching pulses only during frame switching pulses. By adding slave switching pulses is possible to not only carry out an overload regulation, but also to limit the current rise time for long frame switching pulses without using additional inductors. By omission of slave switching pulses overload states of longer duration can be corrected; on the other hand high frequency load currents can be generated with reduced switching losses in this manner.

In a other embodiment, the insertion of additional slave switching pulses is forwent during short frame switching pulses, and, if required, only a width of the slave switching pulses compared to a width of the frame switching pulses is reduced. For limiting the dynamic losses it is reasonable to add slave switching pulses only if the width of the corresponding frame switching pulse is at least one, preferred two magnitudes longer than the turn-on or turn-off transient time of a single semiconductor power switch. With the combination of a pulse frequency and pulse width modulation of the slave pattern as compared to the primary pattern an especially flexible, activation of the parallel circuit independent of the frame pulse length can be implemented.

In a further embodiment several semiconductor power switches are controlled in such a way that their secondary patterns correspond, when combined, to the primary pattern and/or that their slave switching pulses correspond, when combined, to a frame switching pulse. With this complementation of the relevant or, if necessary, all secondary patterns the turn-on times are advantageously distributed among the currently conducting switches and thereby their additional load currents are limited, without limiting the relieving effect for the temporarily turned-off or less conductive switches.

In additional embodiments the number of slave switching pulses are regulated in response to a thermal load and/or a pulse width modulation of the primary pattern for individual or concurrently for all semiconductor power switches.

In a last embodiment, for attaining a high clock rates of the total current, a primary pattern with N frame switching pulses is divided into N secondary patterns, each with exactly one slave switching pulse, and the secondary patterns are systematically or randomly attributed to N semiconductor power switches of the parallel circuit.

Further embodiments, advantages and applications of the invention ensue from the dependent claims as well as from the description by means of the figures that follows now.

In the figures equal parts are provided with equal reference marks.

MODE FOR CARRING OUT THE INVENTION

Figure 1:
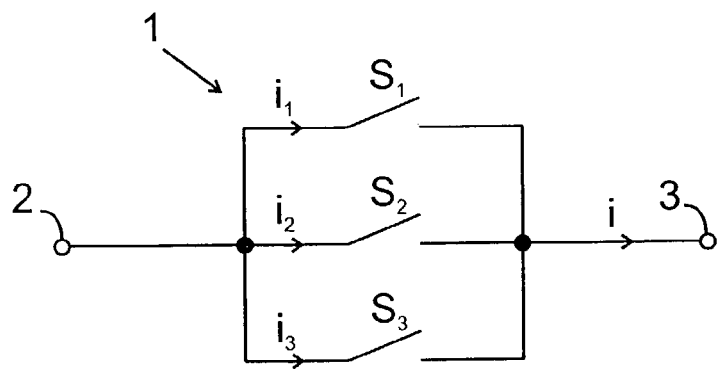
FIG. 1 shows schematically a parallel circuit with, as an example, 3 semiconductor power switches.

FIG. 1 shows a parallel circuit 1 of N semiconductor power switches $S_1$, $S_2$, $S_3$, wherein, as an example, N=3 is used. The parallel circuit 1 comprises a power connector 2 to feed current to and a power connector 3 to collect current from a load. A master control signal with a primary pattern 4 of frame switching pulses is provided to the parallel circuit 1 for a total current i through the parallel circuit 1. The semiconductor power switches $S_1$, $S_2$, $S_3$ are controllable with individual control signals.

FIG. 2 shows examples of secondary patterns of slave switching pulses according to the invention, by means of which the individual semiconductor power elements $S_1$, $S_2$, $S_3$ connected directly in parallel are modulated. In this context it is essential for the invention that the number of slave switching pulses in at least one secondary pattern 51, 52, 53 is chosen to be different from the number of frame switching pulses of the primary pattern 4. The variation of the number of individual slave switching pulses relates in each case to the conductive state of the parallel circuit 1, which is characterized by the present of a frame switching pulse controlling the total current.

The secondary patterns 51, 52, 53, can be changed again in subsequent time frames of the primary pattern 4, which subsequent time frames are not shown, e.g. to absorb peak load on different semiconductor power switches $S_1$, $S_2$, $S_3$. In the meantime, the secondary pattern 51, 52, 53 can, of course, have a number of pulses adapted to those of the primary pattern 4.

Figure 2A:
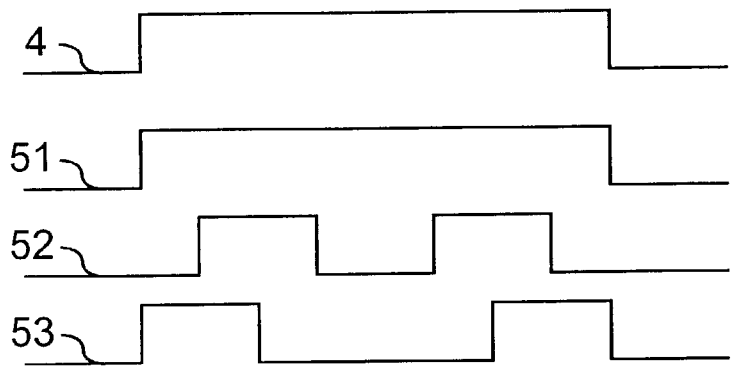
FIG. 2 shows switching patterns according to the invention with (a) additional, (b) omitted and (c) complementarily omitted slave switching pulses.

FIG. 2a) shows a snap-shot in time in which, during a frame switching pulse, two shorter, shifted in time slave switching pulses are applied to each of the switches $S_2$ and $S_3$. The number, width and the temporal offset of the slave switching pulses can be varied in a large range. During this, care must be taken that the total current capacity of the parallel circuit 1 in the conductive state is not constricted overly, i.e. that overload currents on individual switches $S_1$, $S_2$, $S_3$ are temporally and with their amplitude kept inside the secure operational area (SOA), and that at the same time, for individual or several semiconductor power switches $S_1$, $S_2$, $S_3$, the desired relief effect is achieved. In particular, for at least two switches $S_2$, $S_3$, the slave switching pulses can be chosen such that they do not substantially overlap and, in each case, are complementing parts of a frame switching pulse.

Advantageously, during the turn-on transient of the frame switching pulse a plural of the switches $S_1$, $S_2$, $S_3$ are activated with slave switching pulses, i.e. switched to a conducting state in order to limit the transient overcurrents which are typically generated because of the discharge performance of the free wheeling diodes in series.

With the method according to the invention the total turn-on time of the secondary pattern 51, 52, 53 is reduced compared to the primary pattern 4. The reduction is to be chosen depending on the number of parallel switches $S_1$, $S_2$, $S_3$, to the required load current i and the desired thermal relief of the switches $S_1$, $S_2$, $S_3$. In parallel circuits 1 in inverters the reduction of the average power loss can amount e.g. to at least 5%, preferably at least 20%, especially preferred at least 50%.

Figure 2B:
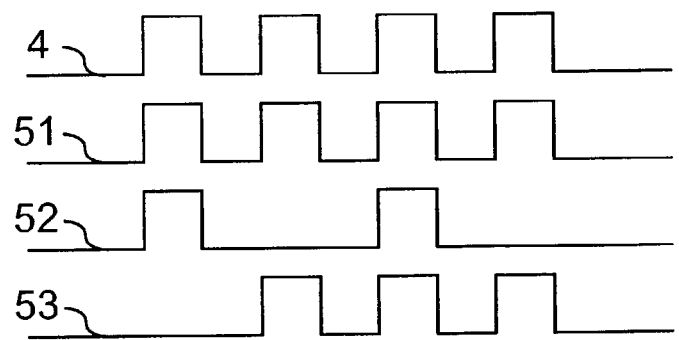

FIG. 2b) shows a example for the omission of slave switching pulses at the switches $S_2$ and $S_3$ in respect to the primary pattern 4. This method is especial helpful for short frame switching pulses, which e.g. occur in pulse width modulation of sine waves in the proximity of zero crossings. If the width of the frame switching pulses goes below a critical length of time, e.g. 100 times to 10 times of a turn-on or turn-off transient time of the semiconductor power switches $S_1$, $S_2$, $S_3$, the benefit of the insertion of slave switching pulses is namely nullified because the dynamical losses rise. Therefore individual switches $S_1$, $S_2$, $S_3$ of the parallel circuit 1 are better relieved by omission of slave switching pulses. If necessary, the width of the slave switching pulses is, in addition, shorted as compared to a width of the frame switching pulses.

Figure 2C:
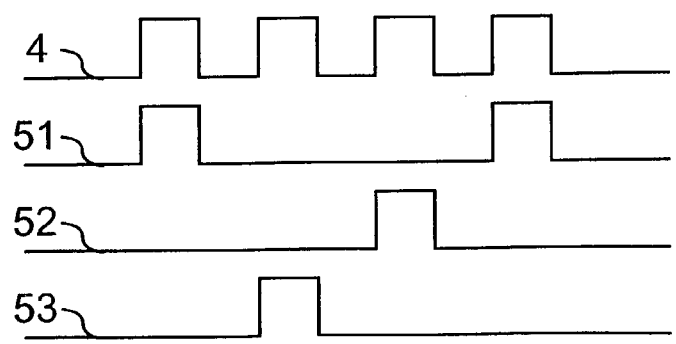

FIG. 2c) shows an example where the switches $S_1$, $S_2$, $S_3$ are controlled by omission of slave switching pulses with secondary patterns 51, 52, 53, which correspond, when combined, to the primary pattern 4. This method is especially suited for the generation of high frequency currents i, e.g. for operating high power radio transmitters or inductive heating or inductive welding. The individual switches $S_1$, $S_2$, $S_3$ can be clocked correspondingly slower. In addition the total current losses are reduced. For example the turn-off losses for IGBTs increase only marginally under short-time current overload as compared to a normal current load. Thus it is more favorable to operate one IGBT $S_1$; $S_2$; $S_3$ under short overload then all $S_1$, $S_2$, $S_3$ under normal load.

The attribution of the secondary pattern 51, 52, 53 to the N=3 semiconductor power switches $S_1$, $S_2$, $S_3$ can be constant. However, it can also be varied after one or several cycles of N=3 frame switching pulses according to a periodic scheme or in random manner, in particular in statistically uniform manner. Randomly occurring thermal load variations among the switches $S_1$, $S_2$, $S_3$ are balanced best with a random attribution.

Figure 3A:
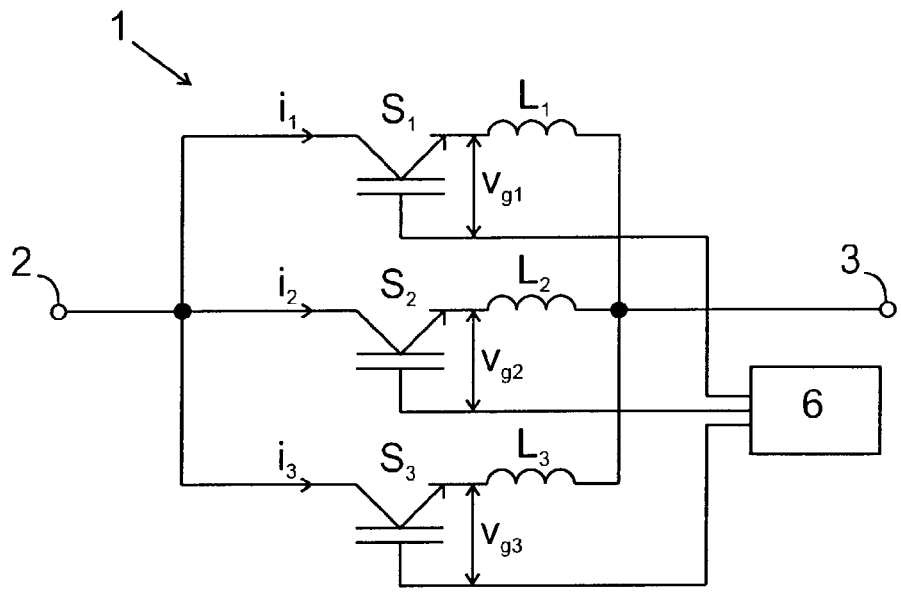
FIG. 3 shows, for parallel IGBTs, the dynamic performance of the balance regulator upon addition of a slave switching pulse in comparison to the current amplitude modulation according to the state of the art (dashed).

FIG. 3 shows the dynamic performance of partial load currents $i_1$, $i_2$, $i_3$ in case of three parallel IGBT-switches $S_1$, $S_2$, $S_3$ each with inductances $L_1$, $L_2$, $L_3$ in series. In the example a turn-on delay 7 of the IGBT $S_1$, e.g. due to different inductances $L_1$, $L_2$, $L_3$ or unequal internal parameters of the IGBTs $S_1$, $S_2$, $S_3$, generates an asymmetrical current rise $i_1$ in comparison to the regular trend of the currents $i_2$, $i_3$. In addition, the time integral of the voltage over the inductor $L_1$ causes an overshoot 8 of the stationary current value $i_1$, inversely proportional to $L_1$.

According to the prior art the current overshoot 8 is limited, on the one hand, by choosing very large inductances $L_1$, $L_2$, $L_3$, e.g. 10 μH as compared to the IGBT internal 50 nH. But large inductors $L_1$, $L_2$, $L_3$ limit the switching time, because too high induction voltages, which are proportional to the current gradients, can not be tolerated. On the other hand, in the prior art (EP 0 664 613 A2) the height of the gate voltage $v_{g1}$ is modified to adjust the current amplitude $i_1$. According to the dashed line in FIG. 3b) a reduction of 10% of the gate voltage $v_{g1}$ causes only a marginal reduction of the current amplitude $i_1$. Therefore, an adaptation of the currents $i_1$, $i_2$, $i_3$ is possible only with slowly delay times over many frame switching pulses.

Figure 3B:
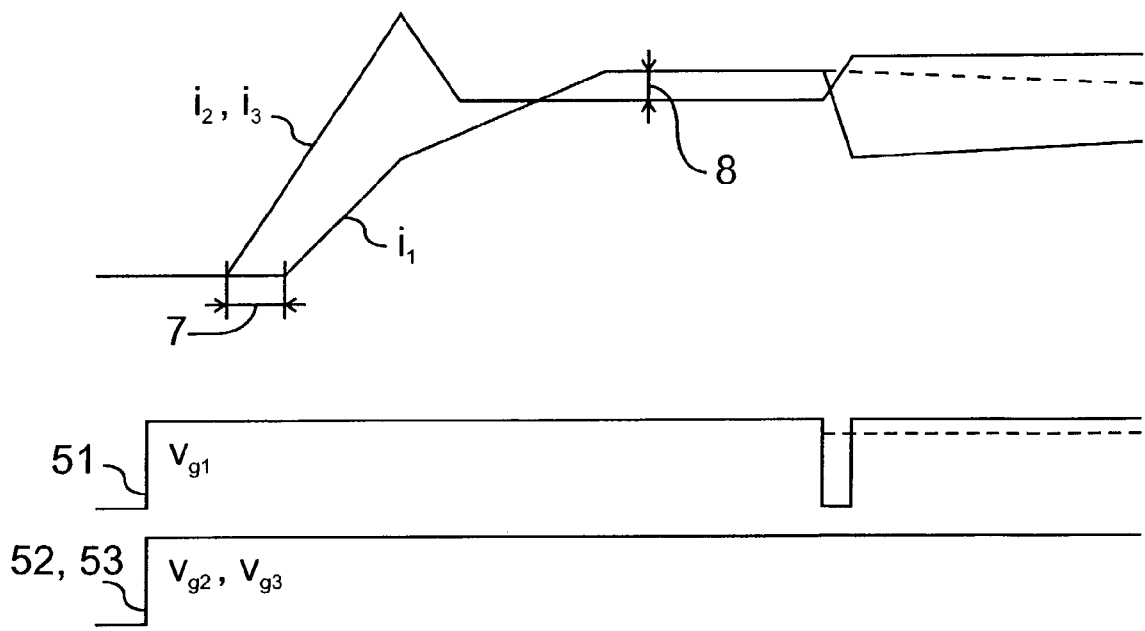

In contrast to this, according to the invention, by the insertion of a slave switching pulse at the gate voltage $v_{g1}$ of the IGBT $S_1$ the current $i_1$ is nearly instantaneously decreased and in particular even in the same frame switching pulse 4, such that the average values of the currents $i_1$, $i_2$ and $i_3$ over the frame switching pulse 4 are balanced. In the example of FIG. 3b) an amplitude ratio of the gate voltage slave switching pulse of 20 is used. In addition to the amplitude ratio, the width of the slave switching pulse can be adapted in such a way that, by dint of the slave switching pulses, a stationary partial load current amplitude $i_1$ through the semiconductor power switch $S_1$ is varied by at least a factor two. In an extreme case, in particular for semiconductor power switches $S_1$, $S_2$, $S_3$ that can not be modulated in amplitude, they are switched back and forth by the slave switching pulses between a conductive and substantial non-conductive state.

Overload states on single switches $S_1$, $S_2$, $S_3$ can therefore be adjusted much faster and also more precisely than before. For this reason the method is applicable also for higher frame switching pulse frequencies than before. The main benefit of the method is that the inductances $L_1$, $L_2$, $L_3$ are not longer used for the limitation of the stationary overcurrents and therefore can be dimensioned to be smaller. Furthermore, the regulation of the number of slave switching pulses according to the invention is compatible with other methods for dynamical symmetrisation of the transient turn-on and turn-off behavior, e.g. according to EP 0 664 613 A2. In this case inductances in series $L_1$, $L_2$, $L_3$ can be further reduced or omitted completely. Thus, in particular for IGBTs, a very fast switching can be achieved with very low dynamic losses and a high symmetry of the stationary loads at the same time.

An especially advantageous embodiment of the invention relates to an active regulation 6 of the number of slave switching pulses of at least one secondary pattern 51, 52, 53 in dependence of a load of the corresponding semiconductor power switch $S_1$, $S_2$, $S_3$ of the parallel circuit 1. Where applicable, the regulation 6 also depends on a pulse width modulation of the frame switching pulses in the primary pattern 4. In particular, a total turn-on time of the secondary pattern 51, 52, 53 is reduced proportionally to the load of the corresponded semiconductor power switch $S_1$, $S_2$, $S_3$. The reduction of the turn-on time is achieved by one or several additional or omitted slave switching pulses. The regulation 6 can intervene in the same or in the following frame switching pulses, as long as it is comparably as fast as the terminal delay time of the corresponding switches $S_1$, $S_2$, $S_3$.

In detail, an actual load value of the semiconductor power switch $S_1$, $S_2$, $S_3$ is measured and if it exceeds a desired load value, a number of slave switching pulses per frame switching pulse is increased or decreased. The actual load value and desired load value can be a temperature of the semiconductor power switch $S_1$, $S_2$, $S_3$, a collector current or a cathode current through the semiconductor power switch $S_1$, $S_2$, $S_3$ or a sort-time average value of these quantities. The temperature can be measured on the casing, the cooling unit or the semiconductor power switch itself. The regulation 6 can be provided with a hysteresis in common way or with delay times for limitation of the slave switching rates. Advantageously, all switches $S_1$, $S_2$, $S_3$ of the parallel circuit 1 are thermal simultaneously symmetrised with a common balance regulation 6.

The parallel circuit 1 controlled according to the invention can be part of a switch module, in particular of a half bridge arm of an inverter for traction, high voltage DC transmission, radio transmitter, inductive heating or inductive welding. Suitable semiconductor power switches $S_1$, $S_2$, $S_3$ are BJTs ("bipolar junction transistors"), IGBTs, MOSFETs, thyristors, GTOs, in particular those with integrated driver unit, MCTs ("MOSFET-controlled thyristors") or related devices or combinations of such devices. The method is also suited in particular for parallel circuits of semiconductor power switches that have power outlets being impossible or difficult to regulate in amplitude.

The invention claimed is:

1. Method for operating a parallel circuit of semiconductor power switches, wherein the parallel circuit comprises a power connector to feed current to and a power connector to collect current from a load, wherein a master control signal with a primary pattern of frame switching pulses is provided to the parallel circuit for a total current through the parallel circuit, wherein further the semiconductor power switches are controllable with individual control signals, said method comprising the steps of
   a) generating at least one secondary pattern of slave switching pulses for the individual control signal of at least one semiconductor power switch,
   b) using, at least temporarily, during a number of frame switching pulses in the primary pattern, a different number of slave switching pulses in the secondary pattern is for relieving the semiconductor power switch of the parallel circuit in a conductive state, and
   c) generating, at least temporarily during individual frame switching pulses, several slave switching pulses in the secondary pattern.

2. The method of claim 1, wherein the slave switching pulses in the secondary pattern are not continuous.

3. The method of claim 1, wherein the number of slave switching pulses are not increased, compared to the number of frame switching pulses, during short frame switching pulses with a pulse width maximally 100 times longer than a transient switching time of the semiconductor power switch.

4. The method of claim 1, wherein at least two semiconductor power switches are controlled with secondary patterns that correspond, when combined, to the primary pattern.

5. The method of claim 1, wherein a stationary partial load current amplitude through at least one semiconductor power switch is varied by the slave switching pulses by at least a factor two.

6. The method of claim 1, wherein a number of slave switching pulses in the secondary pattern is regulated in response to a load of the corresponding semiconductor power switch of the parallel circuit.

7. A method for operating a parallel circuit of semiconductor power switches, wherein the parallel circuit comprises a power connector to feed current to and a power connector to collect current from a load, wherein a master control signal with a primary pattern of frame switching pulses is provided to the parallel circuit for a total current through the parallel circuit, wherein further the semiconductor power switches are controllable with individual control signals, said method comprising the steps of
   a) generating at least one secondary pattern of slave switching pulses for the individual control signal of at least one semiconductor power switch,
   b) using, at least temporarily, during a number of frame switching pulses in the primary pattern, a different number of slave switching pulses in the secondary pattern is for relieving the semiconductor power switch of the parallel circuit in a conductive state, and c) generating, at least temporarily during individual frame switching pulses, several slave switching pulses in the secondary pattern, wherein a number of slave switching pulses in the secondary pattern is regulated in response to a load of the corresponding semiconductor power switch of the parallel circuit, an actual load value of the semiconductor power switch is measured, and a number of slave switching pulses per frame switching pulse is increased or decreased if the actual load value is exceeding a desired load value, wherein a time that a given semiconductor power switch is switched-on is decreased with increasing load of the given semi-conductor power switch.

8. A method for operating a parallel circuit of semiconductor power switches, wherein the parallel circuit comprises a power connector to feed current to and a power connector to collect current from a load, wherein a master control signal with a primary pattern of frame switching pulses is provided to the parallel circuit for a total current through the parallel circuit, wherein further the semiconductor power switches are controllable with individual control signals, said method comprising the steps of a) generating at least one secondary pattern of slave switching pulses for the individual control signal of at least one semiconductor power switch, b) using, at least temporarily, during a number of frame switching pulses in the primary pattern, a different number of slave switching pulses in the secondary pattern is for relieving the semiconductor power switch of the parallel circuit in a conductive state, and c) generating, at least temporarily during individual frame switching pulses, several slave switching pulses in the secondary pattern, wherein a number of slave switching pulses in the secondary pattern is regulated in response to a load of the corresponding semiconductor power switch of the parallel circuit, an actual load value of the semiconductor power switch is measured, and a number of slave switching pulses per frame switching pulse is increased or decreased if the actual load value is exceeding a desired load value, wherein a time that a given semiconductor power switch is switched-on is decreased with increasing load of the given semi-conductor power switch, wherein a number of the slave switching pulses of all secondary patterns is concurrently regulated by a compensation regulator for thermal symmetrisation of the parallel circuit.

9. The method of claim 1, wherein the parallel circuit is a slave of a switch module.

10. The method of claim 3, wherein a width of the slave switching pulses, compared to a width of the frame switching pulses, is shorted.

11. The method of claim 1, wherein at least one semiconductor power switch is switched back and forth by the slave switching pulses between a conductive and substantial non-conductive state.

12. The method of claim 1, wherein a number of slave switching pulses in the secondary pattern is regulated in response to a pulse width of frame switching pulses.

13. The method of claim 6, wherein a total turn-on time of the secondary pattern is proportionally reduced to the load of the corresponding semiconductor power switch.

14. The method of claim 7, wherein the actual load value and the desired load value are a temperature of the semiconductor power switch, a collector current or cathode current that passes the semiconductor power switch or a short-time average value of these quantities.

15. The method of claim 9, wherein the parallel circuit is a slave of a switch module for a half bridge arm of an inverter for traction, high voltage DC transmission, radio transmitters, inductive heating or inductive welding.

16. The method of claim 1, wherein the semiconductor power switches are BJT, IGBTs, MOSFETs, thyristors, GTOs, MCTs or combinations of such devices.

17. The method of claim 16, wherein the semiconductor power switches have power outlets the amplitude of which is impossible or difficult to control.

* * * * *